United States Patent
Hurwitz et al.

(10) Patent No.: US 11,444,432 B2
(45) Date of Patent: Sep. 13, 2022

(54) LASER DRIVER PULSE SHAPING CONTROL

(71) Applicant: Analog Devices International Unlimited Company, Limerick (IE)

(72) Inventors: Jonathan Ephraim David Hurwitz, Edinburgh (GB); Davide Portaluppi, Sardinia (IT)

(73) Assignee: Analog Devices International Unlimited Company, Limerick (IE)

( * ) Notice: Subject to any disclaimer, the term of this patent is extended or adjusted under 35 U.S.C. 154(b) by 256 days.

(21) Appl. No.: 16/780,761

(22) Filed: Feb. 3, 2020

(65) Prior Publication Data

US 2021/0242660 A1     Aug. 5, 2021

(51) Int. Cl.
| H01S 5/042 | (2006.01) |
| H01S 5/183 | (2006.01) |
| H01S 5/00 | (2006.01) |
| G01S 7/484 | (2006.01) |
| G01S 7/4865 | (2020.01) |
| G01S 17/894 | (2020.01) |

(52) U.S. Cl.
CPC .......... H01S 5/0428 (2013.01); G01S 7/484 (2013.01); G01S 7/4865 (2013.01); G01S 17/894 (2020.01); H01S 5/0035 (2013.01); H01S 5/183 (2013.01)

(58) Field of Classification Search
CPC ...... G02S 7/484; H01S 5/1071; H01S 5/0035; H01S 5/0428; H01S 5/0622; H01S 5/00
USPC ........................................................ 372/25
See application file for complete search history.

(56) References Cited

U.S. PATENT DOCUMENTS

| 5,742,379 A * | 4/1998 | Reifer ............... G01S 17/32 356/5.07 |
| 6,414,974 B1 | 7/2002 | Russell et al. |
| 8,184,670 B2 | 5/2012 | Crawford et al. |
| 9,054,485 B1 | 6/2015 | Ng |
| 9,368,936 B1 | 6/2016 | Lenius et al. |
| 9,603,210 B1 | 3/2017 | Carlen |
| 9,711,934 B2 | 7/2017 | Wakabayashi et al. |
| 10,048,358 B2 * | 8/2018 | Berger ............... G01S 17/06 |

(Continued)

FOREIGN PATENT DOCUMENTS

| CN | 113206442 A | 8/2021 |
| CN | 113206589 A | 8/2021 |

(Continued)

OTHER PUBLICATIONS

"U.S. Appl. No. 16/780,735, Preliminary Amendment Filed Feb. 2, 2021", 8 pgs.

(Continued)

*Primary Examiner* — Tuan N Nguyen
(74) *Attorney, Agent, or Firm* — Schwegman Lundberg & Woessner, P.A.

(57) ABSTRACT

Time-of-flight (ToF) systems which use pulsed laser diodes, are required to measure distances with high level of precision and control. The present disclosure provides a method and a corresponding system for controlling a temporal response of a laser diode, in particular pulsed laser diodes. In particular, the present disclosure provides a method and a related system for driving a laser diode so as to obtain predominantly a peak pulse response while minimising or completely avoiding the post-peak response in a temporal response of the laser diode.

20 Claims, 8 Drawing Sheets

(56) References Cited

U.S. PATENT DOCUMENTS

| | | | |
|---|---|---|---|
| 10,256,605 | B2 | 4/2019 | Gassend et al. |
| 10,270,527 | B1 | 4/2019 | Mentovich et al. |
| 2008/0013646 | A1* | 1/2008 | Hamada ............... H04B 1/0475 375/297 |
| 2014/0204396 | A1 | 7/2014 | Giger et al. |
| 2016/0358544 | A1 | 12/2016 | Fu |
| 2017/0070029 | A1 | 3/2017 | Moeneclaey et al. |
| 2018/0145482 | A1 | 5/2018 | Lee et al. |
| 2018/0180978 | A1 | 6/2018 | Yamada et al. |
| 2018/0284242 | A1 | 10/2018 | Campbell |
| 2018/0299536 | A1* | 10/2018 | Marron ................... G01S 17/58 |
| 2018/0301872 | A1 | 10/2018 | Burroughs et al. |
| 2019/0267911 | A1 | 8/2019 | Lawson |
| 2019/0386460 | A1 | 12/2019 | Barnes et al. |
| 2021/0239838 | A1 | 8/2021 | Neil et al. |
| 2021/0242661 | A1 | 8/2021 | Hurwitz et al. |
| 2021/0273405 | A1 | 9/2021 | Neil et al. |

FOREIGN PATENT DOCUMENTS

| | | |
|---|---|---|
| CN | 113207207 A | 8/2021 |
| DE | 102018120251 | 3/2019 |
| JP | 5509537 | 4/2014 |
| WO | 2017003681 | 1/2017 |
| WO | 2018125825 | 7/2018 |
| WO | 2019167039 | 9/2019 |

OTHER PUBLICATIONS

"Chinese Application Serial No. 202110148602.1, Notification to Make Rectification dated Mar. 26, 2021", 2 pgs.

"Chinese Application Serial No. 202110148602.1, Response filed May 21, 2021 to Notification to Make Rectification dated Mar. 26, 2021", 19 pgs.

"European Application Serial No. 21152618.1, Extended European Search Report dated Jun. 18, 2021", 10 pgs.

"European Application Serial No. 21152620.7, Extended European Search Report dated Jun. 22, 2021", 13 pgs.

"European Application Serial No. 21152619.9, Extended European Search Report dated Jun. 23, 2021", 9 pgs.

U.S. Appl. No. 17/165,477, filed Feb. 2, 2021, Light Source System.

Zbik, Mateusz, "Charge-Line Dual-FET High-Repetition-Rate Pulsed Laser Driver", Applied Sciences, 9(7), 1289, (2019), 12 pgs.

Hallman, Lauri, "A High-Speed Power Laser Transmitter for Single Photon Imaging Applications", IEEE Sensors, (2014), 1157-1160.

Hallman, Lauri, "On Two-Dimensional Rangefinding Using ~1 nJ ~100 ps Laser Diode Transmitter and a CMOS SPAD Matrix", IEEE Photonics Journal, 10(4), (Aug. 2018), 13 pgs.

Kostamovaara, Juha, "On Laser Ranging Based on High-Speed Energy Laser Diode Pulses and Single-Photon Detection Techniques", IEEE Photonics Journal, 7(2), (Apr. 2015), 16 pgs.

* cited by examiner

LASER DRIVER PULSE SHAPING CONTROL

FIELD OF DISCLOSURE

The present disclosure relates to methods and related systems for determining a duration, $T_{dr}$, for a laser drive signal, to minimise post-peak response in a temporal response of a laser diode driven by the laser drive signal.

BACKGROUND

Time-of-flight (ToF) camera systems are range imaging systems that resolve the distance between the camera and an object by measuring the round trip time of a light signal emitted from the ToF camera system. The systems typically comprise a light source (such as a laser or LED), a light source driver to control the emission of light from the light source, an image sensor to image light reflected by the subject, an image sensor driver to control the operation of the image sensor, optics to shape the light emitted from the light source and to focus light reflected by the object onto the image sensor, and a computation unit configured to determine the distance to the object by determine the amount of time between an emission of light from the light source and a corresponding reflection from the object.

ToF camera systems may measure distances ranging from a few centimetres to 100s or 1000s of metres. Given the high speed of light, a time difference of only 16.66 ns between an emission of light and reception of reflected light corresponds to an object 2.5 m from the camera system. Therefore, ToF camera systems require high levels of temporal precision and control in order to measure distances accurately.

SUMMARY OF DISCLOSURE

The present disclosure provides a method and a related system for determining a duration, $T_{dr}$, for a laser drive signal, to minimise post-peak response in a temporal response of a laser diode driven by the laser drive signal.

The proposed method of the present invention has an advantage that it can be implemented using a low-bandwidth system. That is, the proposed method uses an iterative process for calibrating the temporal response of a pulsed laser diode as opposed to attempting to calibrate the response in a single step. The proposed method involves iteratively applying a test drive signal to the laser diode and, in each iteration, monitoring an output of a photodetector, where the output is indicative of an energy of a light pulse output by the laser diode in response to the application of the test drive signal. The proposed method determines an optimised laser drive signal duration based on the monitored output in successive iterations.

When the proposed method and related system is used to calibrate a pulsed laser diode in a ToF system, it has an advantage of improving the accuracy of the distance measurements as the method enables minimisation of post-peak emissions by the laser diode. The method may also enable the determination of a true zero-time for a ToF measurement.

According to a first aspect of this disclosure, there is provided a method of determining a duration, $T_{dr}$, for a laser drive signal, to minimise post-peak response in a temporal response of a laser diode driven by the laser drive signal, the method comprising: iteratively: applying a test laser drive signal having a test duration, $T_t$, to the laser diode; and monitoring an output of a photodetector, wherein the output is indicative of an energy of a light pulse output by the laser diode in response to the application of the test drive signal; varying the test duration, $T_t$, of the test drive signal with successive iterations; and determining the duration, $T_{dr}$, based on the monitoring of the output of the photodetector in successive iterations.

According to a second aspect of this disclosure, there is provided a control unit for determining a duration, $T_{dr}$, for a laser drive signal, to minimise post-peak power in a temporal response of a laser diode driven by the laser drive signal, wherein an input of the control unit is configured to be coupled to an output of a photodetector; an output of the control unit is configured to be coupled to an input of the laser diode, wherein the control unit is configured to: iteratively: apply a test laser drive signal having a test duration, $T_t$, to the laser diode; and monitor an output of a photodetector, wherein the output is indicative of an energy of a light pulse output by the laser diode in response to the application of the test drive signal; vary the test duration, $T_t$, of the test drive signal with successive iterations; and determine the duration, Tar, based on the monitoring of the output of the photodetector in successive iterations.

According to a third aspect of this disclosure, there is provided a system for determining a duration, $T_{dr}$, for a laser drive signal, to minimise post-peak response in a temporal response of a laser diode driven by the laser drive signal, the system comprising: a laser diode; a photodetector; a control unit coupled between the laser diode and the photodetector, wherein the control unit is configured to: iteratively: apply a test laser drive signal having a test duration, $T_t$, to the laser diode; and monitor an output of a photodetector, wherein the output is indicative of an energy of a light pulse output by the laser diode in response to the application of the test drive signal; vary the test duration, $T_t$, of the test drive signal with successive iterations; and determine the duration, $T_{dr}$, based on the monitoring of the output of the photodetector in successive iterations.

Further features of the disclosure are defined in the appended claims.

BRIEF DESCRIPTION OF THE DRAWINGS

The teachings of this disclosure will be discussed, by way of non-limiting examples, with reference to the accompanying drawings, in which.

DETAILED DESCRIPTION

Time-of-flight (ToF) camera systems, which use pulsed laser diodes, may be required to measure distances with high level of precision and control. The inventors have realised that the spatial resolution of distance measurements can be improved by using laser diodes which are driven in a way that results in the emission of temporally narrow light pulses—for example, with a light pulse duration of 100 ps or less. A short duration light pulse may improve the precision of a ToF camera in part because the exact time of light emission from the ToF camera may be known to within a smaller error range.

The inventors have also realised that a number of safety regulations limit the average optical power emitted from ToF camera systems with no limit on the peak optical power output. By emitting very short duration light pulses from the laser, the light pulses may have a higher peak optical power, whilst staying within safety regulations. Higher peak optical powers may bring further benefits in improving the precision and/or maximum distance range of the ToF camera.

Figure 1:
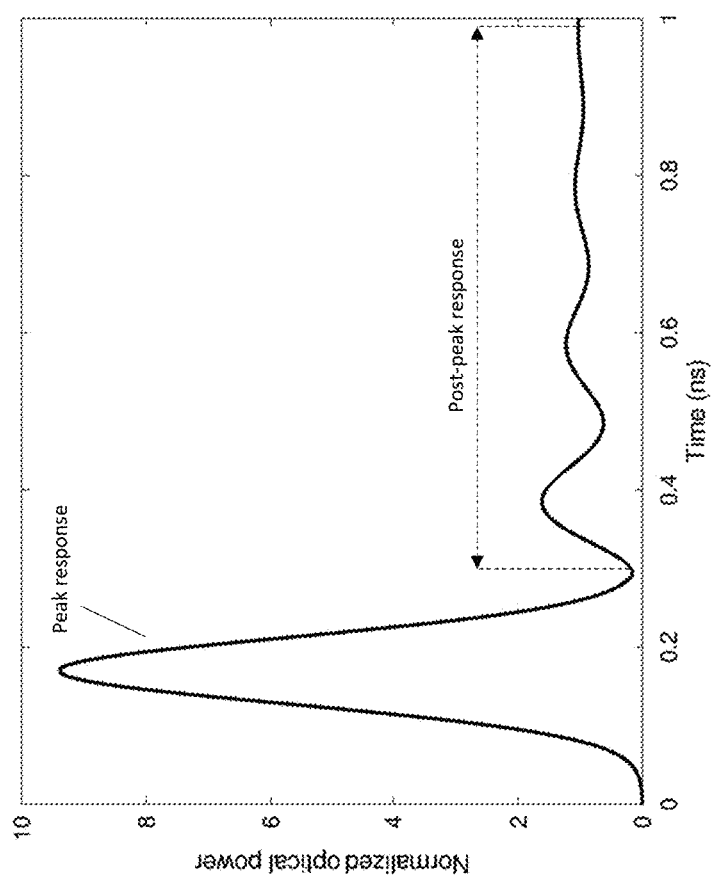
FIG. 1 is a graph of the temporal response of a laser diode showing the peak and post-peak response.

FIG. 1 shows an example plot of a temporal response of a typical pulsed laser diode, in particular a Vertical Cavity Surface-Emitting Laser (VCSEL). As seen in the graph of FIG. 1, this particular example high power pulsed laser diode exhibits a response where the peak pulse width is relatively narrow, that is, it is approximately 10-20 ps. The peak response is followed by a relatively lower power, post-peak response with a much longer duration.

The inventors have realised that if the laser diode can be driven for long enough to obtain predominantly the peak response while minimizing or completely eliminating the post-peak response, a short duration, high optical power light pulse may be output from the laser diode. The inventors have realized that one way of minimizing, or substantially eliminating, the post-peak response is to disable the laser (i.e., stop driving the laser) substantially at the end of the peak response, before the post-peak response begins (for example, approximately at the first dip or first post-peak minimum in the temporal response).

Given the above, the inventors have recognized that there exists a need for a robust and an efficient method for determining a duration of a laser drive signal that will result in the laser outputting most, or all, of the initial peak response whilst minimizing the post-peak response, a short duration, high optical power light pulse may be achieved.

However, the required drive signal duration may vary between diodes due to process variability in the manufacturing process of the laser diodes. Also, the required drive signal duration may vary due to temperature or other operating condition relating power supply, bias target output, etc. Furthermore, the optimal drive signal duration may also change over the lifetime of the laser diode, for example as a result of device drift, environmental conditions, temperature conditions, etc. Moreover, if the duration of the drive signal or the drive time is too long, the temporal response of the laser diode may also include the undesirable post-peak response. If the duration of the drive signal or the drive time is too short, some of the useful peak response of the laser may be missed, and in the most extreme cases the laser diode may not be driven for long enough to begin lasing. Therefore, it may be beneficial to calibrate laser diodes at the time of manufacture and/or intermittently during their lifetime so that the duration of the laser drive signal may be optimized.

However, in order to determine the optimal laser drive signal duration for a laser diode, the inventors have recognised that it is practically challenging to sample the temporal response of a laser diode, which typically has a peak pulse duration of 100 ps or less. That is, a very high bandwidth system—for example, with bandwidth in the order of GHz—would be required for sampling the temporally narrow peak pulse at a sufficient resolution to identify even approximately where the peak response ends. Such a high bandwidth system may be costly and complex and is not desirable for practical implementations.

The inventors have devised calibration methods that can be used to optimize the drive signal duration or drive signal time in order to avoid, or at least minimize, the post-peak response of a laser diode, without requiring very high bandwidth sampling systems.

Figure 2A:
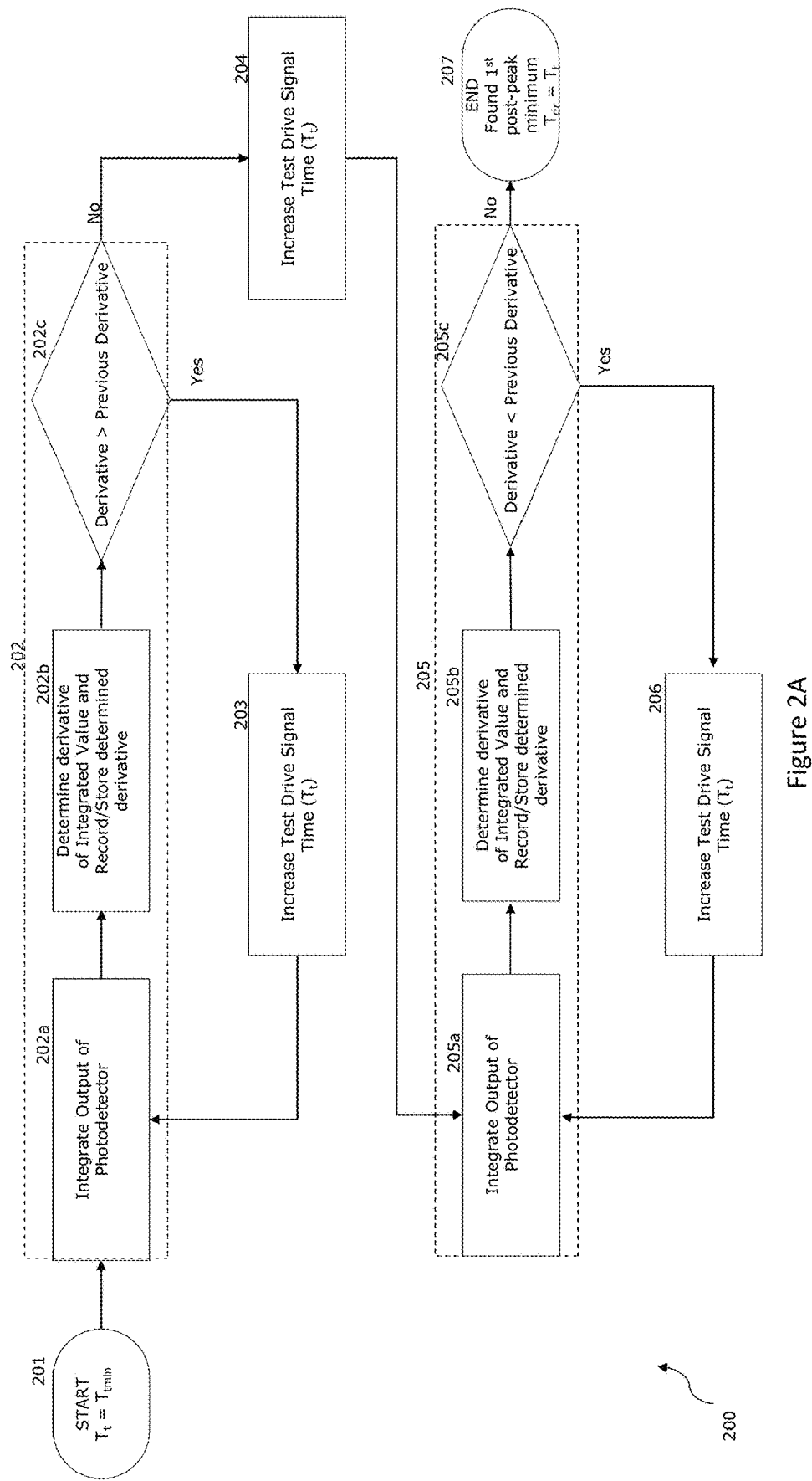
FIG. 2A is a flow chart of a method, according to an aspect of this disclosure, to determine an optimum laser drive signal duration to minimise post-peak response in a temporal response of a laser diode.

FIG. 2A shows a flow chart of a method 200, according to an aspect of this disclosure. As will be described in more detail below, the method 200 involves iteratively applying a test drive signal to the laser diode and, in each iteration, monitoring an output of a photodetector, where the output is indicative of an energy of a light pulse output by the laser diode in response to the application of the test drive signal.

The duration of the test drive signal is varied between successive iterations. The duration of the test drive signal can be varied in a stepwise manner over a predetermined time range. The method involves determining the optimum duration for the laser drive signal based on the monitoring of the output of the photodetector in successive iterations.

Figure 2B:
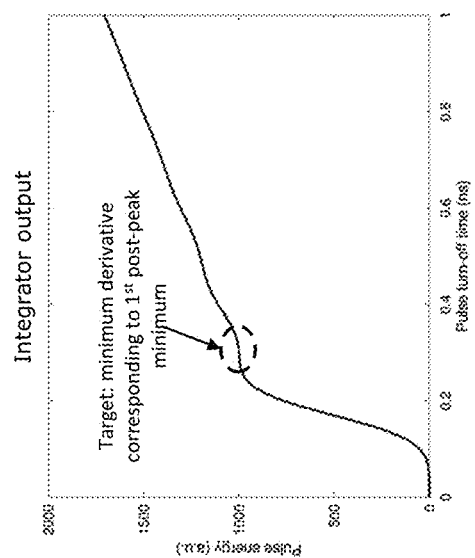
FIG. 2B is a graph of the integrated photodetector output versus test signal duration, when the system of FIG. 4A is used for implementing either of the methods in FIG. 2A or FIG. 3.
Figure 2C:
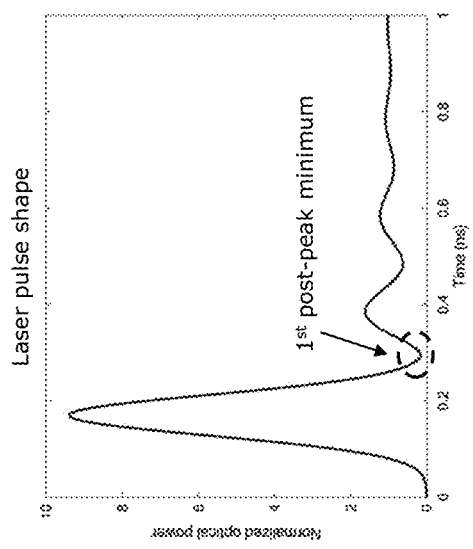
FIG. 2C is a graph of the temporal response of a laser diode showing the first post-peak minimum.

FIG. 2B shows a graph of a monitored output of the photodetector, in this case, an integrated photodetector output, versus the end time of the test drive signal. FIG. 2C shows the corresponding temporal response of the laser diode over time. The flow chart of FIG. 2A will now be explained, where relevant, with reference to the graphs of FIG. 2B and FIG. 2C to enhance the understanding of the method in FIG. 2A.

FIG. 2A indicates that the method 200 is performed in iterations. A test drive signal with a minimum test duration $T_t$ is applied to the laser diode (step 201). An output of a photodetector is monitored (step 202), where the output is indicative of an energy of a light pulse output by the laser diode. Monitoring of the output can comprise integrating the output of the photodetector (step 202a) over the test duration of the test drive signal, or over an integration duration that is longer than the test duration of the test drive signal, and recording or storing this output. By way of non-limiting example, each iteration may be repeated every 0.1 µs-10 µs, which corresponds to a frequency of 100 KKHz-10 MHz, which may be fairly typical for a direct ToF system. The integration duration may be set to any duration of time that is larger than the maximum expected test duration of the test drive signal and less than the iteration repetition period (for example, any duration between about ins to 80 ns, such as a duration of between about 5 ns to 10 ns). In any event, the integrated value need only be read, or sampled, once each iteration or laser light pulse, so in the non-limiting example given about, once every 0.1 µs-1 µs, corresponding to a sampling frequency of about 100 KHz-10 MHz As a result, it can be seen that relatively low sampling bandwidths (orders of magnitude lower than would be required to accurately sample in a single light pulse emission the temporal response of the laser diode represented in FIGS. 1 and 2C) are required for the system, which may lower the bandwidth and/or power requirements for the detector and integrator. The integrated photodetector output corresponding to each test drive signal can be plotted as shown in FIG. 2B. A rate of change of the integrated value between successive iterations is then determined (step 202b). With reference to FIG. 2B, it may be appreciated that the rate of change of the integrated value between successive iterations is the slope (or derivative) of the integrated photodetector output between successive iterations. The integrated photodetector output is indicative of the total energy of the light pulse output by the laser diode over the test duration of the test drive signal. Therefore, the rate of change (or derivative) of this integrated output can be understood to be indicative of the power of the light pulse output by the laser diode at the end of the test drive signal (see FIG. 2C).

Monitoring of the output can further comprise comparing the determined rate of change with a previously determined rate of change in a previous iteration immediately preceding the current iteration—in FIG. 2A, a comparison is performed to check if the determined rate of change (or derivative) is greater than the previously determined rate of change in the previous iteration (step 202c). With reference to FIG. 2B, the step 202c equates to a comparison to check if the slope of the integrated photodetector output curve over the current test signal duration is relatively steeper than the slope of the integrated photodetector output curve at the previous test signal duration. If the result of the said comparison is true, the test duration of the test drive signal is increased for another iteration (step 203) and the method returns to step 202a. With reference to FIG. 2B, it can be seen that the slope of the integrated photodetector output curve increases at least until approximately 0.2 ns—this indicates a rising edge in the peak power pulse (see corresponding temporal response of the laser diode in FIG. 2C). If the result of the said comparison is false, then this result is an indication that the optical peak has been detected. This is illustrated in FIG. 2B where the slope of the integrated photodetector output curve at approximately 0.2 ns is relatively less steep than the slope of the integrated output curve at, for example, 0.1 ns. As seen in FIG. 2C, the peak power output of the laser diode occurs at a time between 0.1 ns and 0.2 ns. The flow chart in FIG. 2A shows that if the result of the said comparison is false, the test duration of the test drive signal is increased for another iteration (step 204) and the method proceeds to step 205a. In step 205, the output of the photodetector is monitored as described above and, in particular, a subsequent comparison (step 205c) is performed on whether the rate of change of the integrated value in the current iteration is smaller than the rate of change of the integrated value in the previous iteration, immediately preceding the present iteration. This comparison of the rate of change of the integrated value between successive iterations is used to identify a first post-peak minimum in the temporal response of the laser diode. If the result of the comparison at step 205c is true, the test duration of the test drive signal is increased for another iteration (step 206). If the result of the comparison at step 205c is false, it indicates that the first post-peak minimum in the temporal response of the laser diode has been identified (step 207). This is illustrated in FIG. 2B, where the slope of the curve in the encircled region, at approximately 0.3 ns, starts to increase in steepness, having earlier plateaued. As seen in corresponding temporal response in FIG. 2C, this corresponds to the first post-peak minimum in the temporal response of the laser diode. A first post-peak minimum in the temporal response of the laser diode marks the end of the peak response of the laser diode. Therefore, if the result of the comparison at step 205c is false, the method is ended (step 207) and the optimum drive signal duration $T_{dr}$ may then be set as the test duration $T_t$ of the test drive signal corresponding to the end of the peak response. Ideally, $T_{dr}$ is set to the test drive signal duration which corresponds to the first post-peak minimum in the temporal response of the laser diode. However, in some embodiments, $T_{dr}$ may be set to a test drive signal duration that is approximately equal to the test duration $T_t$ at which the post-peak minimum is identified such that the resulting temporal response is predominantly a peak response but may not exactly end at the first post-peak minimum. For example, it may be set to a slightly longer duration to ensure that all of the peak response should be achieved, even if a small amount of post-peak response also occurs as a result. Alternatively, it may be set to a slightly shorter duration to ensure that all of the post-peak response should be avoided, even if a small amount of the peak response is also lost as a result. Thus, it can be seen that the method 200 first of all detects the peak output of the temporal response of the laser diode, and then identifies the first minimum in the temporal response of the laser diode following that peak.

Optionally, as the photodetector maybe subject to light that comes from another source than the laser diode (eg ambient light that comes through the laser optics from the scene) or have dark current, it may be necessary to account for this background signal by measuring the response of the photodetector at a second time without activating the laser so as to understand and account for any background level of signal.

Figure 3:
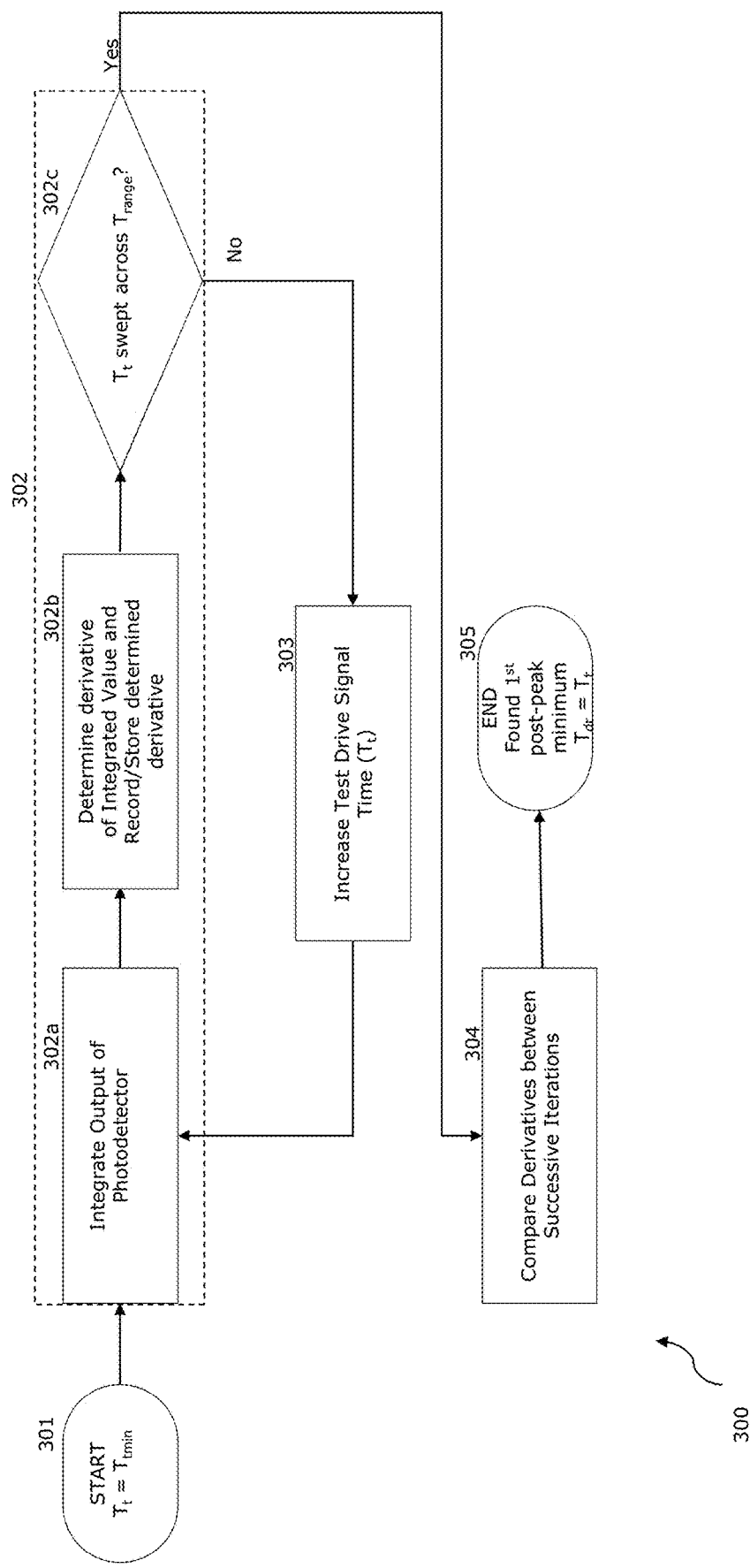
FIG. 3 is a flow chart of a method, according to a further aspect of this disclosure, to determine an optimum laser drive signal duration to minimise post-peak response in a temporal response of a laser diode.

FIG. 3 shows a flow chart of a method 300 according to another aspect of this disclosure. The method 300 is similar to the method 200 in FIG. 2, in that this method is also an iterative process. A test drive signal with a minimum test duration $T_t$ is applied to the laser diode (step 301). An output of a photodetector is monitored (step 302), where the output is indicative of an energy of a light pulse output by the laser diode. Steps 302a and 302b are performed in the same way as described above with respect to Steps 202a and 202b in FIG. 2. As shown in FIG. 3, in step 302c, a check is performed to see if the test duration $T_t$ has been swept across a predetermined time range, $T_{range}$, for the drive signal time. The predetermined time range, $T_{range}$, can be set to be long enough to ensure that the temporal response of the laser diode includes the peak response as well as at least part of the post-peak response. If the result of step 302c indicates that the test drive signal duration, $T_t$, has not yet been swept across the entire predetermined time range, the test drive signal duration, $T_t$, is increased for another iteration (step 303) and the method returns to step 302a. Once the test signal duration, $T_t$, is swept across the entire predetermined time range, a comparison of the rate of change of the integrated value between successive iterations may be performed, as already explained above for method 200, to identify a first post-peak minimum in the temporal response of the laser diode (step 304). Any suitable analysis (for example, the step-by-step comparison of integrated values described above with reference to FIG. 2A, or any other suitable process) may be used that identifies the first minimum in the temporal response at which the integrated output is non-zero (to exclude the very first minimum in the temporal response, which is at a time before the laser has emitted any time—eg time 0 ns in the plot of FIG. 2C for this identification). The optimum drive signal duration, $T_{dr}$, may then be set as the test duration, $T_t$, of the test drive signal corresponding to the end of the peak response, preferably corresponding to the identified first post-peak minimum in the temporal response of the laser diode (step 305).

In some other aspects of this disclosure, step 302b may instead be recording/storing the integrated output determined in step 302a. In this case, at step 304, the integrated photodetector output may be plotted against the corresponding test drive signal durations as shown in FIG. 2B and the first post-peak minimum identified by identifying the minimum derivative of the integrated output using any suitable mathematical method.

Although the methods in FIG. 2A and FIG. 3 show that the test duration $T_t$ of the test drive signal is increased in successive iterations, it is also possible to implement this method by decreasing the test duration $T_t$ of the test drive signal in successive iterations, starting with a predetermined maximum value of $T_t$ for the first iteration.

The methods as shown in FIGS. 2A and 3 are advantageous in that the determined drive signal duration may be optimised to obtain predominantly the peak response while minimising, and ideally eliminating, the post-peak response.

Figure 4:
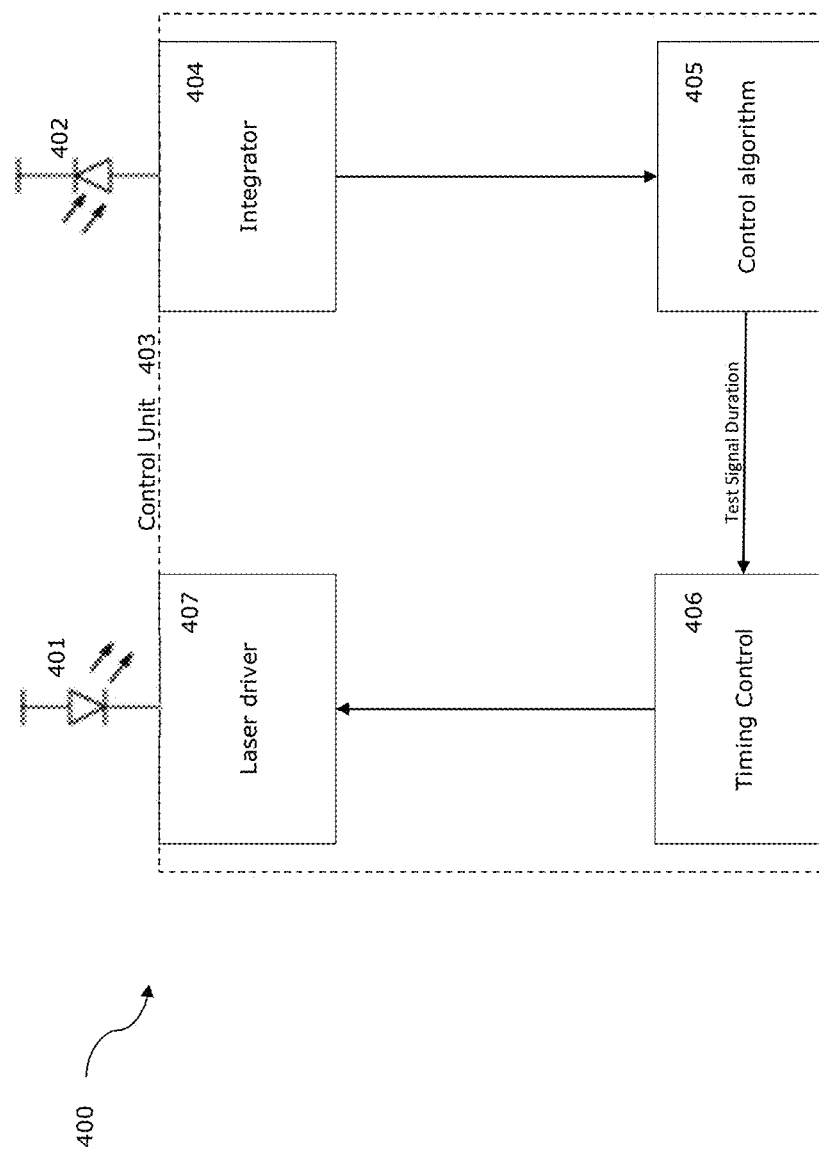
FIG. 4 is a block diagram representing a system, according to an aspect of this disclosure, for use in determining an optimum laser drive signal duration to minimise post-peak response in a temporal response of a laser diode.

FIG. 4 shows a block diagram of a system 400 according to an embodiment of this disclosure. The system 400 of FIG. 4A can be used to implement either of the methods shown in FIG. 2A or FIG. 3. The system 400 comprises a laser diode 401, a photodetector 402 and a control unit 403 coupled between the laser diode 401 and the photodetector 402. In particular, the input of the control unit 403 is coupled to the output of the photodetector 402 and the output of the control unit 403 is coupled to the input of the laser diode 401. The photodetector 402 is used to detect at least a portion of the light output by the laser diode 401. The output of the photodetector 402 is indicative of the energy of the light pulse output by the laser diode 401. In FIG. 4, the control unit 403 comprises an integrator 404 configured to receive the output from the photodetector and integrate this output. That is, the integrator 404 of the control unit 403 can be used to implement step 202a in the method 200 of FIG. 2A or step 302a in the method 300 of FIG. 3. The integrator 404 may be implemented using any standard integrator circuits or techniques and can be configured to output its data to a control algorithm unit 405. The start and end of an integration period may be controlled by any suitable entity, such as the control algorithm 405 or any other entity, to coincide with a test drive signal applied to the laser diode 401, as described earlier with reference to FIGS. 2A and 3. The control algorithm unit 405 is configured to perform a laser drive signal duration calibration, as described earlier with respect to FIGS. 2A and 3. In particular, the control algorithm 405 may processes the integration data output from the integrator 404 and outputs a test drive signal duration to a time control unit 406, which is configured to control the drive time of the laser driver 407. That is, the control algorithm unit 405 can be configured to perform the steps of determining the derivative of the integrated value (step 202b), storing/recording the determined derivative (step 202b) and comparing the derivative values between successive iterations (step 202c), as described above with reference to the method 200 in FIG. 2. With respect to the method 300 in FIG. 3, the control algorithm unit 405 can be configured to perform the steps of determining the derivative of the integrated value (step 302b), storing/recording the determined derivative (step 302b), checking if the test drive signal duration $T_t$ has been swept across a predetermined time range, $T_{range}$, for the drive signal time (step 302c), and comparing the derivative values between successive iterations (step 304). The time control unit 406 is configured to apply the test drive signal to the laser driver 407, with a duration set by the test signal drive duration obtained from the control algorithm unit for each iteration. After the optimum drive signal duration $T_{dr}$ has been determined (step 207 in method 200 or step 305 in method 300), it may be recorded/stored (for example in memory in the timing control 406, or elsewhere) and then used for driving the laser driver 407 in the future, which results in a temporal response of the laser diode 401 that is predominantly a peak response with minimized post-peak response.

Although FIG. 4 shows the laser driver 407 as part of the control unit 403, the laser driver 407 can alternatively be a separate device coupled to the control unit 403. In a further alternative, the timing control 406 may also be a separate device (optionally integrated with the laser driver 407, or separate from the laser driver 407 as represented in FIG. 4), with the control unit 403 being configured for coupling to the photodiode 402 and the timing control 406, and being configured to perform the calibration process described above. As such, the control unit 403 may be a standalone device that can be retro fitted to existing laser systems, such as existing ToF laser packages. In a packaged product, the control unit 403 may be on the same die as the laser driver 408 or on a different die. In a further alternative, the photodetector 402 may be integrated into the control unit 403. The light detected by the photodetector 402 may comprise stray reflections of light output from the laser diode 401, the stray reflections arising from, for example, the optical packaging of the laser diode 401 and the photodetector 402 in a ToF system.

Figure 5:
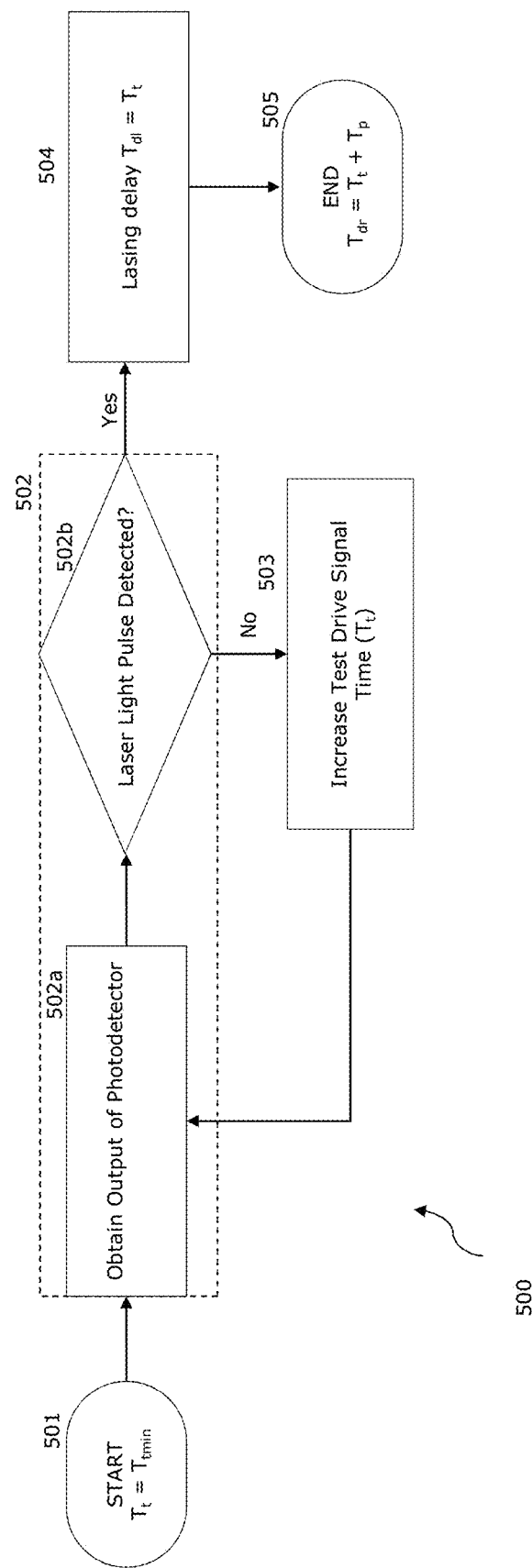
FIG. 5 is a flow chart of a method, according to a further aspect of this disclosure, to determine an optimum laser drive signal duration to minimise post-peak response in a temporal response of a laser diode.

FIG. 5 shows a flow chart of a method 500 according to another aspect of this disclosure. The method 500 is performed in iterations. In each iteration, a test drive signal with a test drive signal duration, $T_t$, is applied to the laser diode. The test drive signal duration is initially set to a starting, or minimum, value $T_{min}$ (step 501). The minimum test drive signal duration $T_{min}$ may be set to a drive signal duration that is less than the expected lasing delay of the laser diode, so that no light output is expected. In each iteration, the output of a photodetector is monitored (step 502), where the output is indicative of an energy of light output by the laser diode. In this method, the output of the photodetector is monitored for an indication that the photodetector has detected light output by the laser diode (step 502b). If there is no indication of light output being detected, the test drive signal duration is increased for another iteration (step 503) and the method returns to step 502a. At the first indication that the photodetector has detected light output by laser diode, the test drive signal duration, $T_t$, corresponding to the timing of this detection may be set as the lasing delay, $T_{dl}$ (step 504), as it represents the amount of length of delay for the laser diode between applying a drive signal and light output beginning. The optimum drive signal duration $T_{dr}$ for obtaining predominantly the peak response, while minimising the post-peak response, may then be set based on the determined lasing delay $T_{dl}$ and a predetermined duration, $T_p$ for the light pulse output by the laser (step 505). In particular, the optimum drive signal duration, $T_{dr}$, may be set as the sum of the determined lasing delay $T_{dl}$ and the predetermined pulse duration $T_p$. The predetermined pulse duration $T_p$ can be the desired duration of the light pulse output by the laser diode, which may be the expected duration of the peak response in the temporal response of the laser diode. The lasing delay for laser diodes may vary for different laser diodes owing to manufacturing variations, etc., and contributes to the variability in optimum laser drive times between different laser diodes. Therefore, determining the lasing delay $T_{dl}$ and setting the drive signal duration $T_{dr}$ based on the lasing delay $T_{dl}$ may result in a more optimised drive signal duration $T_{dr}$ compared with using a default, uncalibrated, drive signal duration.

Although the method 500 in FIG. 5 shows that the test duration $T_t$ of the test drive signal is increased in successive iterations, it is also possible to implement this method by decreasing the test duration $T_t$ of the test drive signal in successive iterations, starting with a predetermined maximum value of $T_t$ for the first iteration (which may be set, for example, to a time duration which will almost certainly result in light being emitted from the laser diode). In this case, the output of the photodetector is monitored for an indication that the photodetector has not detected a light output by the laser diode. When light emission is detected by the photodetector (equivalent of step 502b), the test drive signal time $T_t$ is reduced for the next iteration (equivalent of step 503). For the first iteration at which that the photodetector has not detected light output by laser diode (in the equivalent of step 502), the test drive signal duration, $T_t$, corresponding to the timing of this detection may be set as the lasing delay, $T_{dl}$. The optimum drive signal $T_{dr}$ is then set based on the determined lasing delay $T_{dl}$ and a predetermined duration $T_p$, as already explained above with respect to method 500.

Method 500 provides an advantage of determining the effective start time of the light pulse output by the laser with improved accuracy, that is, by accounting for the lasing delay. In a ToF system configured to implement this method for calibrating the laser diode, knowing the effective start time of the light pulse output by the laser diode is useful information for subsequent distance measurements.

As described earlier, the method 200 or method 300, may enable the detection of the end of the peak response by identifying the first post-peak minimum in the temporal response of the laser diode. The method 500 enables the detection of the start of the peak response by determining a lasing delay between a point in time when the drive signal is applied to the laser diode and a point in time when the laser diode starts to emit a light pulse in response to the applied drive signal. Whilst the method of 500 can also be used to determine the drive signal duration $T_{dr}$, which may be sufficiently optimised for many applications and purposes, the drive signal duration $T_{dr}$ determined using this method may not be quite as optimised as that determined using method 200 or 300, since it is based on assumed pulse duration $T_p$, which may be subject to some variability between laser diodes. Therefore, it is optionally possible to combine the method of either 200 or 300 with the method 500 to enable determination of the lasing delay while also optimising the drive time to minimise any post-peak emissions in the temporal response, thereby exploiting the benefits of both methods.

Figure 6:
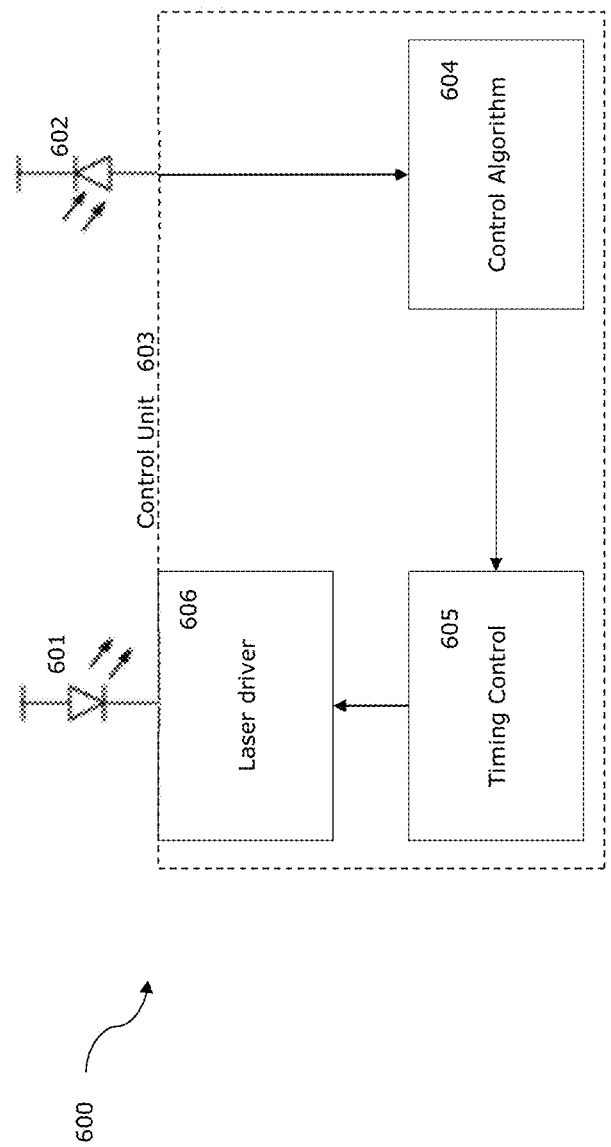
FIG. 6 is a block diagram representing a system, according to an aspect of this disclosure, for use in determining an optimum laser drive signal duration to minimise post-peak response in a temporal response of a laser diode.

FIG. 6 shows a system 600 according to another aspect of this disclosure. This system is suitable for implementing the method in FIG. 5. The system 600 is similar to the system 400 in that it comprises a laser diode 601, a photodetector 602 and a control unit 603 coupled between the laser diode 601 and the photodetector 602. The photodetector 602 can be a photodiode with high sensitivity, for example a single photon avalanche diode (SPAD), or may be any other suitable type of photodiode. An SPAD is sensitive to individual photons and therefore may improve the detection of a light pulse output by the laser diode 601, even if this emission occurs at a relatively low power compared to the peak output power of the laser diode 601. For example, a SPAD could enable the detection of the rising edge of the light pulse output by the laser diode 601, where the rising edge is at a relatively lower power than the peak power output by the laser diode 601 (see FIG. 1).

As SPADs may be subjected to Dark Count events not due to light, and the system may be exposed to ambient photons not from the laser diode (eg ambient light that comes through the laser optics from the scene) the system 600 may optionally be configured to repeat iterations a plurality of times (for example, repeating a particular test signal duration multiple times when a light output pulse is detected) and use techniques such as histogram analysis and/or filtering and/or windowing to avoid locking the drive signal duration $T_{dr}$ based on erroneous light emission events.

In system 600, the control unit 603 is configured to determine the lasing delay and set the optimum drive signal duration $T_{dr}$ based on the determined lasing delay $T_{dl}$ and a predetermined duration $T_p$ for the light pulse output by the laser diode 601.

FIG. 6 shows one such example of a control unit 603 where the control unit 603 comprises control algorithm unit 604, a timing control unit 605 and a laser driver 606. The control algorithm unit 603 is coupled to the output of the photodetector 602 to receive the output by the photodetector 602. The control algorithm unit 603 is configured to process the output of the photodetector to determine the lasing delay, $T_{dl}$. With respect to the method 500 in FIG. 5, the control algorithm unit 603 is configured to perform a laser drive signal duration calibration by obtaining the output of the photodetector (step 502a), checking if a light pulse from the laser diode 601 is detected by the photodetector 602 (step 502b) and output, to the timing control unit 605, a respective value of the test drive signal duration based on the result of the check in step 502b. Upon the first detection of the light pulse output by the laser diode 601, by the photodetector 602, the control algorithm may determine the lasing delay $T_{dl}$ (step 504) and optionally store the determined lasing delay $T_{dl}$ (for example in memory in the control unit 603, or elsewhere). The control algorithm 405 may determine the drive signal duration $T_{dr}$ based on the determined lasing delay $T_{dl}$ and the predetermined duration $T_p$ (step 505), which may, for example, have previously been stored in memory in the control unit 603 or been set by an operator. In this case, the control algorithm unit 604 may output the determined drive signal duration $T_{dr}$ to the timing control unit 605 and the timing control unit may be configured to apply this drive signal duration to drive the laser driver 606 for driving the laser diode 601 in the future.

Although FIG. 6 shows the laser driver 606 as part of the control unit 603, the laser driver 606 can also be a separate device coupled to the control unit 603. In a further alternative, the timing control 605 may also be a separate device (optionally integrated with the laser driver 606, or separate from the laser driver 606 as represented in FIG. 6), with the control unit 603 being configured for coupling to the photodiode 602 and the timing control 605, and being configured to perform the calibration process described above. As such, the control unit 603 may be a standalone device that can be retro fitted to existing laser systems, such as existing ToF laser packages. In a packaged product, the control unit 603 may be on the same die as the laser driver 606 or on a different die. In a further alternative, the photodetector 602 may be integrated in the control unit 603. The light detected by the photodetector 602 can also comprise stray reflections of light output from the laser diode 601, the stray reflections arising from, for example, the optical packaging of the laser diode 601 and the photodetector 602 in a ToF system.

Figure 7B:
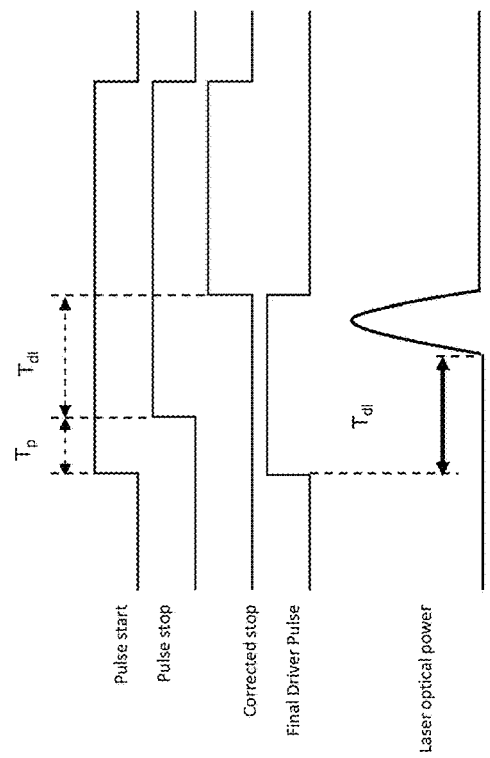
FIG. 7B is a timing diagram to illustrate an aspect of the operation of the system in FIG. 7A.
Figure 7A:
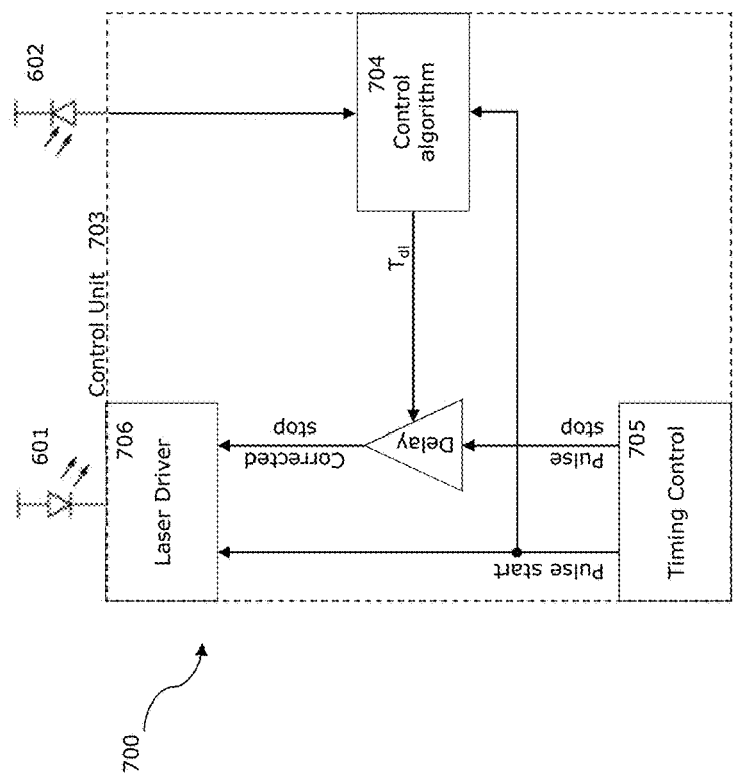
FIG. 7A is a block diagram representing a system, according to a further aspect of this disclosure.

FIG. 7A shows a system 700 according to another aspect of this disclosure. The system 700 is a variant of the system 600 and can also be used to implement the method 500. FIG. 7A comprises the laser diode 601, the photodetector 602 and a control unit 703. The input of the control unit 703 is coupled to the output of the photodetector 602. The output of the control unit 703 is coupled to the input of the laser diode 601.

The control unit 703 comprises a control algorithm unit 704. The control algorithm unit 704 is configured to determine and output the lasing delay $T_{dl}$. In some implementations, the control algorithm unit 704 may comprise, for example, a delay-locked-loop or a time-to-digital converter. The control unit 703 also comprises a timing control unit 705, which is configured to set the duration of the drive signal for the laser driver 706 which, in turn, drives the laser diode 701. In system 700, the timing control unit 705 is configured to receive and/or store a predetermined pulse duration $T_p$ for the light pulse output by the laser diode 701, where $T_p$ is the desired duration for a light pulse to be output from the laser diode 601 and may be the expected duration of the peak pulse in a temporal response of the laser diode 601. The timing control unit 705 applies the predetermined pulse duration to the laser driver by outputting a "pulse start" signal and a "pulse stop signal"—that is, the difference between the time of application of the "pulse start" signal and the "pulse stop" signal corresponds to the predetermined pulse duration $T_p$ for the light pulse output by laser diode 601.

With respect to implementing the method 500 in FIG. 5 with system 700, control algorithm is configured to apply a minimum delay to the pulse stop signal, such that the time difference between 'pulse start' and 'corrected stop' corresponds to a minimum test drive signal duration $T_{tmin}$, at the beginning of the method 500 (step 501). In this case, the minimum delay period may be, for example, 0, such that $T_{tmin}$ is equal to the predetermined signal duration $T_p$. The laser driver 706 then drives the laser diode 601 with a test drive signal of test signal duration $T_{tmin}$. The "pulse start" signal output by the timing control unit 705, triggers the control algorithm unit 704 to monitor the output of the photodetector 602 (step 502a). The control algorithm unit 704 is then configured to process the obtained photodetector output to check if a light pulse output by the laser diode 701 has been detected by the photodetector 702 (step 502b). If a light pulse is not detected, then the control algorithm unit 704 is configured to increase the length of delay applied to the 'pulse stop' signal so that in the next iteration, there is an increase in the test drive signal duration (step 503) applied to the laser driver 706. The control algorithm unit 704 is configured to perform the above-described steps in successive iterations, each time increasing the delay applied to the "pulse stop" signal, thereby increasing the test drive signal duration (step 503), until the first detection of a light pulse by the photodetector 702. Upon the first detection of the light pulse output by the laser diode 701 by the photodetector 702, the control algorithm unit 704 is configured to end its process of obtaining and processing the photodetector output (step 505) and the delay duration output from the control algorithm and applied to the delay block is set as the lasing delay $T_{dl}$, which may then be applied to the "pulse stop" signal for future light pulses. Consequently, the optimised drive signal duration $T_{dr}$, as applied by the timing control unit 705 and the delay block to the laser driver 706, is the difference between the time of application of the "pulse start" signal and the time of application of a "corrected pulse stop signal", where the corrected pulse stop signal is the time of application of the initial "pulse stop" signal delayed by the lasing delay $T_{dl}$.

FIG. 7B is a timing diagram showing the interaction between the different signals as discussed above with respect to FIG. 7A. As seen in FIG. 7B, the pulse stop signal is corrected by applying the lasing delay as determined by the control algorithm unit 704, using a calibration method, for example the method 500. The timing diagram shows that the final drive signal pulse duration is the sum of the predetermined pulse duration, $T_p$, and the lasing delay, $T_{dl}$. FIG. 7B also shows that upon application of this optimised final drive signal pulse to the laser diode 601 by the laser driver 706, there is a lasing delay $T_{dl}$ before the start of the peak pulse response in the temporal response of the laser diode 701 and that the resultant temporal response comprises predominantly of the peak pulse response.

An advantage of the above-mentioned calibration systems (400, 600, 700) implementing the respective methods is that because these systems are relatively simple and low cost (for example, in part because they do not require high-bandwidth sampling of the temporal response to the laser diode and so can be implemented with relatively straightforward and low cost hardware), they can be easily integrated into, for example, ToF products, which use pulsed laser diodes. The calibration systems allow for calibration to be performed at any point, for example, after manufacture of the laser product, system and/or intermittently during the usage of the product. As a result, even as the characteristics of a laser change over time, for example as a result of environment conditions and/or device drift, the laser drive time may be recalibrated to main it at an optimal value.

Additionally or alternatively, the calibration systems may be used for device quality checks over time. For example, initial calibration data (e.g., $T_{dl}$ and/or $T_{dr}$) may be stored (for example in memory in the control unit 403, 603, 403, or in memory elsewhere that is accessible to the control unit) after manufacture. Subsequent recalibrations over the lifetime of the product to determine updated $T_{dl}$ and/or $T_{dr}$ may be compared against the stored initial calibration data. If a significant difference is identified (for example, a different exceeding a predetermined threshold), it may be recognised that the laser diode and/or photodetector and/or aspects of the control circuitry, are not performing sufficiently well and may be at risk of fault or failure. This may provide the opportunity to repair or replace the product before failure occurs, which may be particularly beneficial for safety critical ToF applications. In a further alternative, each time recalibration is performed, the updated data (e.g., updated TL, and/or $T_{dr}$) may be stored. Each new recalibration may then be compared against at least some parts of historic stored data, which comprises the initial calibration data and/or one or more previous recalibration data.

Although this invention has been described in terms of certain embodiments, the embodiments can be combined to provide further embodiments. In addition, certain features shown in the context of one embodiment can be incorporated into other embodiments as well. For example, whilst the system 400 is described specifically as being configured to perform method 200 or method 300, in a further alternative the control algorithm 405 may additionally or alternatively be configured to perform method 500, since it will be appreciated that the output of integrator 404 is indicative of whether or not any light has been output from the photodiode.

Whilst the laser diode is particularly identified as a high power pulsed VCSEL, it is not necessarily limited to this type and the system and methods may be used with any other type of laser diode. The control unit (403, 603, 703) can be configured in any way that executes the calibration methods, for example, by using microcontrollers, programmable logic arrays or even as software that executes on one or more processors to perform the calibration method. Whilst the invention is particularly useful for calibrating laser drive times for use in ToF applications, it is not limited to this application and may be equally useful for any application which implements a pulsed laser diode.

In each of the methods described above, the test duration of the test drive signal is iteratively varied (i.e., iteratively increased or decreased). It will be appreciated that the size of each iterative increase or decrease may be set to any suitable value depending on the specific requirements of the system. For example, smaller increases may result in a more accurate determination of the lasing delay and/or first post-peak minimum in the temporal response of the laser diode, but may result in calibration taking longer.

The invention claimed is:

1. A method of determining a duration, $T_{dr}$, for a laser drive signal, to minimise post-peak response in a temporal response of a laser diode driven by the laser drive signal, the method comprising:
   iteratively:
   applying a test drive signal having a test duration, $T_t$, to the laser diode;
   monitoring an output of a photodetector, wherein the output is indicative of an energy of a light pulse output by the laser diode in response to application of the test drive signal;
   varying the test duration, $T_t$, of the test drive signal with successive iterations; and
   determining a temporal response output characteristic of the laser diode with successive iterations; and
   then, in response to the temporal response output characteristic of the laser diode meeting at least one criterion for at least one of the successive iterations, setting the duration, $T_{dr}$, based on the test duration $T_t$.

2. A method according to claim 1, wherein the test duration, $T_t$, of the test drive signal is increased between successive iterations.

3. A method according to claim 1, wherein the test duration, $T_t$, of the test drive signal is decreased between successive iterations.

4. A method according to claim 1, wherein determining the temporal response output characteristic of the laser diode with successive iterations comprises:
   identifying, from the monitored output of the photodetector, a first post-peak minimum in the said temporal of the laser diode; and
   setting the duration, $T_{dr}$, to be the test duration, $T_t$, corresponding to the identified first post-peak minimum.

5. A method according to claim 4, wherein monitoring of the output of the photodetector comprises:
   integrating the output of the photodetector to determine an accumulated value indicative of the cumulative light output of the laser diode in response to the application of the test drive signal.

6. A method according to claim 5, wherein identifying the first post-peak minimum in the said temporal response of the laser diode comprises:
   determining a rate of change of the accumulated value between successive iterations; and
   comparing the determined rate of change with a previously determined rate of change in an iteration immediately preceding the current iteration.

7. A method according to claim 1, wherein determining the duration, $T_{dr}$, based on the monitoring of the output of the photodetector in successive iterations comprises:
   determining a lasing delay, wherein the lasing delay is a minimum test duration, $T_{tmin}$, required to detect a light pulse output by the laser diode; and
   determining the said duration, $T_{dr}$, based on the lasing delay and a predetermined duration $T_p$ of the light pulse output by the laser.

8. A method according to claim 7, further comprising:
   comparing the determined lasing delay against one or more previously determined lasing delays for the laser diode, to check the condition of the laser diode.

9. A method according to claim 1, further comprising:
   comparing the determined determining the duration, $T_{dr}$, against one or more previously determined durations, $T_{dr}$ for the laser diode, to check the condition of the laser diode.

10. A control unit for determining a duration, $T_{dr}$, for a laser drive signal, to minimise post-peak power in a temporal response of a laser diode driven by the laser drive signal, and comprising an input for coupling to an output of a photodetector, and an output for coupling to an input of the laser diode, wherein the control unit is configured to:
    iteratively:
    apply a test drive signal having a test duration, $T_t$, to the laser diode;
    monitor an output of the photodetector, wherein the output is indicative of an energy of a light pulse output by the laser diode in response to application of the test drive signal;
    vary the test duration, $T_t$, of the test drive signal with successive iterations; and
    determining a temporal response output characteristic of the laser diode with successive iterations; and
    then, in response to the temporal response output characteristic of the laser diode meeting at least one criterion for at least one of the successive iterations. setting the duration, $T_{dr}$, based on the test duration $T_t$.

11. A control unit according to claim 10, wherein the control unit is configured to increase the test duration, $T_t$, of the test drive signal between successive iterations.

12. A control unit according to claim 10, wherein the control unit is configured to decrease the test duration, $T_t$, of the test drive signal between successive iterations.

13. A control unit according to claim 10, wherein the control unit is configured to:
    identify the temporal response output characteristic, from the monitored output of the photodetector, wherein the temporal response output characteristic is a first post-peak minimum in the said temporal response of the laser diode; and
    set the duration, $T_{dr}$, to be the test duration, $T_t$, corresponding to the identified first post-peak minimum.

14. A control unit according to claim 13, wherein the control unit comprises:
    an integrator configured to receive the output of the photodetector and integrate the output of the photodetector to determine an accumulated value indicative of the cumulative light output of the laser diode in response to the application of the test drive signal.

15. A control unit according to claim 14, wherein the control unit is configured to:
- determine a rate of change of the accumulated value between successive iterations; and
- compare the determined rate of change with a previously determined rate of change in a previous iteration immediately preceding the current iteration in order to identify the first post-peak minimum in the said temporal response of the laser diode.

16. A control unit according to claim 10, wherein the control unit is configured to:
- determine a lasing delay, wherein the lasing delay is a minimum test duration, $T_{Tmin}$, required to detect a light pulse output by the laser diode; and
- determine the said duration, $T_{dr}$, based on the lasing delay and a predetermined duration $T_p$ of the light pulse output by the laser.

17. A control unit according to claim 10, further configured to
- compare the determined determining the duration, $T_{dr}$ against one or more previously determined durations, $T_{dr}$ for the laser diode, to check the condition of the laser diode.

18. A system for determining a duration, $T_{dr}$, for a laser drive signal, to minimise post-peak response in a temporal response of a laser diode driven by the laser drive signal, the system comprising:
- a laser diode;
- a photodetector;
- a control unit to the laser diode and the photodetector, wherein the control unit is configured to:
- iteratively:
- apply a test drive signal having a test duration, $T_t$, to the laser diode;
- monitor an output of a photodetector, wherein the output is indicative of an energy of a light pulse output by the laser diode in response to application of the test drive signal;
- vary the test duration, $T_t$, of the test drive signal with successive iterations; and
- determining a temporal response output characteristic of the laser diode with successive iterations; and
- then, in response to the temporal response output characteristic of the laser diode meeting at least one criterion for at least one of the successive iterations, setting the duration, $T_{dr}$, based on the test duration $T_t$.

19. A system according to claim 18 wherein the laser diode is a pulsed laser diode.

20. A system according to claim 18 wherein the laser diode is a vertical cavity surface emitting laser diode (VCSEL).

* * * * *